(12) United States Patent
Gilton

(10) Patent No.: US 6,858,482 B2
(45) Date of Patent: Feb. 22, 2005

(54) METHOD OF MANUFACTURE OF PROGRAMMABLE SWITCHING CIRCUITS AND MEMORY CELLS EMPLOYING A GLASS LAYER

(75) Inventor: Terry L. Gilton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 38 days.

(21) Appl. No.: 10/121,792

(22) Filed: Apr. 10, 2002

(65) Prior Publication Data

US 2003/0194865 A1 Oct. 16, 2003

(51) Int. Cl.[7] .................. H01L 21/44; H01L 21/302
(52) U.S. Cl. .................. 438/199; 438/238; 438/287; 438/294; 438/653; 438/656; 438/690
(58) Field of Search ................... 438/199, 238, 438/287, 294, 597, 652, 653, 656, 690, 692

(56) References Cited

U.S. PATENT DOCUMENTS

| | | | |
|---|---|---|---|
| 3,271,591 | A | 9/1966 | Ovshinsky |
| 3,622,319 | A | 11/1971 | Sharp |
| 3,743,847 | A | 7/1973 | Boland |

(List continued on next page.)

FOREIGN PATENT DOCUMENTS

| | | |
|---|---|---|
| JP | 56126916 | 10/1981 |
| WO | wo 97/48032 | 12/1997 |
| WO | wo 99/28914 | 6/1999 |
| WO | WO 00/48196 | 8/2000 |
| WO | WO 02/21542 | 3/2002 |

OTHER PUBLICATIONS

Axon Technologies Corporation, Technology Description: *Programmable Metalization Cell(PMC)*, pp. 1–6 (Pre–May 2000).

Helbert et al., *Intralevel hybrid resist process with submicron capability*, SPIE vol. 333 Submicron Lithography, pp. 24–29 (1982).

Hilt, Dissertation: *Materials characterization of Silver Chalcogenide Programmable Metalization Cells*, Arizona State University, pp. Title page–114 (UMI Company, May 1999).

Hirose et al., *High Speed Memory Behavior and Reliability of an Amorphous $As_2S_3$ Film Doped Ag*, Phys. Stat. Sol. (a) 61, pp. 87–90 (1980).

Holmquist et al., *Reaction and Diffusion in Silver–Arsenic Chalcogenide Glass Systems*, 62 J. Amer. Ceram. Soc., No. 3–4, pp. 183–188 (Mar.–Apr. 1979).

(List continued on next page.)

Primary Examiner—Stephen Stein
(74) Attorney, Agent, or Firm—Dickstein Shapiro Morin & Oshinsky LLP

(57) ABSTRACT

Programmable conductor memory cells in a stud configuration are fabricated in an integrated circuit by blanket deposition of layers. The layers include a bottom electrode in contact with a conductive region in a semiconductor substrate, a glass electrolyte layer that forms the body of the cell and a top electrode layer. Under the influence of an applied voltage, conductive paths grow through or along the cell body. The layers are patterned and etched to define separate pillars or cells of these stacked materials. A liner layer of an insulating material is deposited over the cells and acts as a barrier to prevent diffusion of the metal in the cell body into other parts of the integrated circuit. Remaining regions between the cells are filled with an insulating layer. At least some of the insulating layer and some of the liner layer are removed to make contact to the top electrode layer of the cell and to the substrate.

27 Claims, 5 Drawing Sheets

U.S. PATENT DOCUMENTS

| | | | |
|---|---|---|---|
| 3,961,314 A | 6/1976 | Klose et al. | |
| 3,966,317 A | 6/1976 | Wacks et al. | |
| 3,983,542 A | 9/1976 | Ovshinsky | |
| 3,988,720 A | 10/1976 | Ovshinsky | |
| 4,177,474 A | 12/1979 | Ovshinsky | |
| 4,267,261 A | 5/1981 | Hallman et al. | |
| 4,269,935 A | 5/1981 | Masters et al. | |
| 4,312,938 A | 1/1982 | Drexler et al. | |
| 4,316,946 A | 2/1982 | Masters et al. | |
| 4,320,191 A | 3/1982 | Yoshikawa et al. | |
| 4,405,710 A | 9/1983 | Balasubramanyam et al. | |
| 4,419,421 A | 12/1983 | Wichelhaus et al. | |
| 4,499,557 A | 2/1985 | Holmberg et al. | |
| 4,597,162 A | 7/1986 | Johnson et al. | |
| 4,608,296 A | 8/1986 | Keem et al. | |
| 4,637,895 A | 1/1987 | Ovshinsky et al. | |
| 4,646,266 A | 2/1987 | Ovshinsky et al. | |
| 4,664,939 A | 5/1987 | Ovshinsky | |
| 4,668,968 A | 5/1987 | Ovshinsky et al. | |
| 4,670,763 A | 6/1987 | Ovshinsky et al. | |
| 4,671,618 A | 6/1987 | Wu et al. | |
| 4,673,957 A | 6/1987 | Ovshinsky et al. | |
| 4,678,679 A | 7/1987 | Ovshinsky | |
| 4,696,758 A | 9/1987 | Ovshinsky et al. | |
| 4,698,234 A | 10/1987 | Ovshinsky et al. | |
| 4,710,899 A | 12/1987 | Young et al. | |
| 4,728,406 A | 3/1988 | Banerjee et al. | |
| 4,737,379 A | 4/1988 | Hudgens et al. | |
| 4,766,471 A | 8/1988 | Ovshinsky et al. | |
| 4,769,338 A | 9/1988 | Ovshinsky et al. | |
| 4,775,425 A | 10/1988 | Guha et al. | |
| 4,788,594 A | 11/1988 | Ovshinsky et al. | |
| 4,795,657 A | 1/1989 | Formigoni et al. | |
| 4,800,526 A | 1/1989 | Lewis | |
| 4,804,490 A | 2/1989 | Pryor et al. | |
| 4,809,044 A | 2/1989 | Pryor et al. | |
| 4,818,717 A | 4/1989 | Johnson et al. | |
| 4,843,443 A | 6/1989 | Ovshinsky et al. | |
| 4,845,533 A | 7/1989 | Pryor et al. | |
| 4,847,674 A | 7/1989 | Sliwa et al. | |
| 4,853,785 A | 8/1989 | Ovshinsky et al. | |
| 4,891,330 A | 1/1990 | Guha et al. | |
| 4,920,078 A | 4/1990 | Bagley et al. | |
| 5,128,099 A | 7/1992 | Strand et al. | |
| 5,159,661 A | 10/1992 | Ovshinsky et al. | |
| 5,166,758 A | 11/1992 | Ovshinsky et al. | |
| 5,177,567 A | 1/1993 | Klersy et al. | |
| 5,219,788 A | 6/1993 | Abernathey et al. | |
| 5,238,862 A | 8/1993 | Blalock et al. | |
| 5,272,359 A | 12/1993 | Nagasubramanian et al. | |
| 5,296,716 A | 3/1994 | Ovshinsky et al. | |
| 5,314,772 A | 5/1994 | Kozicki | |
| 5,315,131 A | 5/1994 | Kishimoto et al. | |
| 5,330,630 A | 7/1994 | Klersy et al. | |
| 5,335,219 A | 8/1994 | Ovshinsky et al. | |
| 5,341,328 A | 8/1994 | Ovshinsky et al. | |
| 5,350,484 A | 9/1994 | Gardner et al. | |
| 5,359,205 A | 10/1994 | Ovshinsky | |
| 5,360,981 A | 11/1994 | Owen et al. | |
| 5,406,509 A | 4/1995 | Ovshinsky et al. | |
| 5,414,271 A | 5/1995 | Ovshinsky et al. | |
| 5,500,532 A | 3/1996 | Kozicki et al. | |
| 5,512,328 A | 4/1996 | Yoshimura et al. | |
| 5,512,773 A | 4/1996 | Wolf et al. | |
| 5,534,711 A | 7/1996 | Ovshinsky et al. | |
| 5,534,712 A | 7/1996 | Ovshinsky et al. | |
| 5,536,947 A | 7/1996 | Klersy et al. | |
| 5,543,737 A | 8/1996 | Ovshinsky | |
| 5,591,501 A | 1/1997 | Ovshinsky et al. | |
| 5,596,522 A | 1/1997 | Ovshinsky et al. | |
| 5,687,112 A | 11/1997 | Ovshinsky | |
| 5,694,054 A | 12/1997 | Ovshinsky et al. | |
| 5,714,768 A | 2/1998 | Ovshinsky et al. | |
| 5,726,083 A | 3/1998 | Takaishi | |
| 5,751,012 A | 5/1998 | Wolstenholme et al. | |
| 5,761,115 A | 6/1998 | Kozicki et al. | |
| 5,789,277 A | 8/1998 | Zahorik et al. | |
| 5,814,527 A | 9/1998 | Wolstenholme et al. | |
| 5,818,749 A | 10/1998 | Harshfield | |
| 5,825,046 A | 10/1998 | Czubatyj et al. | |
| 5,837,564 A | 11/1998 | Sandhu et al. | |
| 5,841,150 A | 11/1998 | Gonzalez et al. | |
| 5,846,889 A | 12/1998 | Harbison et al. | |
| 5,851,882 A | 12/1998 | Harshfield | |
| 5,869,843 A | 2/1999 | Harshfield | |
| 5,896,312 A | 4/1999 | Kozicki et al. | |
| 5,912,839 A | 6/1999 | Ovshinsky et al. | |
| 5,914,893 A | 6/1999 | Kozicki et al. | |
| 5,920,788 A | 7/1999 | Reinberg | |
| 5,933,365 A | 8/1999 | Klersy et al. | |
| 5,976,928 A * | 11/1999 | Kirlin et al. | 438/240 |
| 5,998,066 A | 12/1999 | Block et al. | |
| 6,011,757 A | 1/2000 | Ovshinsky | |
| 6,031,287 A | 2/2000 | Harshfield | |
| 6,072,716 A | 6/2000 | Jacobson et al. | |
| 6,077,729 A | 6/2000 | Harshfield | |
| 6,084,796 A | 7/2000 | Kozicki et al. | |
| 6,087,674 A | 7/2000 | Ovshinsky et al. | |
| 6,117,720 A | 9/2000 | Harshfield | |
| 6,141,241 A | 10/2000 | Ovshinsky et al. | |
| 6,143,604 A | 11/2000 | Chiang et al. | |
| 6,177,338 B1 | 1/2001 | Liaw et al. | |
| 6,236,059 B1 | 5/2001 | Wolstenholme et al. | |
| RE37,259 E | 7/2001 | Ovshinsky | |
| 6,297,170 B1 | 10/2001 | Gabriel et al. | |
| 6,300,684 B1 | 10/2001 | Gonzalez et al. | |
| 6,316,784 B1 | 11/2001 | Zahorik et al. | |
| 6,329,606 B1 | 12/2001 | Freyman et al. | |
| 6,339,544 B1 | 1/2002 | Chiang et al. | |
| 6,348,365 B1 | 2/2002 | Moore et al. | |
| 6,350,679 B1 | 2/2002 | McDaniel et al. | |
| 6,376,284 B1 | 4/2002 | Gonzalez et al. | |
| 6,388,324 B2 | 5/2002 | Kozicki et al. | |
| 6,391,688 B1 | 5/2002 | Gonzalez et al. | |
| 6,404,665 B1 | 6/2002 | Lowery et al. | |
| 6,414,376 B1 | 7/2002 | Thakur et al. | |
| 6,418,049 B1 | 7/2002 | Kozicki et al. | |
| 6,420,725 B1 | 7/2002 | Harshfield | |
| 6,423,628 B1 | 7/2002 | Li et al. | |
| 6,429,064 B1 | 8/2002 | Wicker | |
| 6,437,383 B1 | 8/2002 | Xu | |
| 6,440,837 B1 | 8/2002 | Harshfield | |
| 6,462,984 B1 | 10/2002 | Xu et al. | |
| 6,469,364 B1 | 10/2002 | Kozicki | |
| 6,473,332 B1 | 10/2002 | Ignatiev et al. | |
| 6,480,438 B1 | 11/2002 | Park | |
| 6,487,106 B1 | 11/2002 | Kozicki | |
| 6,487,113 B1 | 11/2002 | Park et al. | |
| 6,501,111 B1 | 12/2002 | Lowery | |
| 6,507,061 B1 | 1/2003 | Hudgens et al. | |
| 6,511,862 B2 | 1/2003 | Hudgens et al. | |
| 6,511,867 B2 | 1/2003 | Lowery et al. | |
| 6,512,241 B1 | 1/2003 | Lai | |
| 6,514,805 B2 | 2/2003 | Xu et al. | |
| 6,518,636 B2 * | 2/2003 | Segawa et al. | 257/411 |
| 6,531,373 B2 | 3/2003 | Gill et al. | |
| 6,534,781 B2 | 3/2003 | Dennison | |
| 6,545,287 B2 | 4/2003 | Chiang | |
| 6,545,907 B1 | 4/2003 | Lowery et al. | |
| 6,555,860 B2 | 4/2003 | Lowery et al. | |
| 6,563,164 B2 | 5/2003 | Lowery et al. | |

| | | | |
|---|---|---|---|
| 6,566,700 B2 | 5/2003 | Xu | |
| 6,567,293 B1 | 5/2003 | Lowery et al. | |
| 6,569,705 B2 | 5/2003 | Chiang et al. | |
| 6,570,784 B2 | 5/2003 | Lowery | |
| 6,576,921 B2 | 6/2003 | Lowery | |
| 6,586,761 B2 | 7/2003 | Lowery | |
| 6,589,714 B2 | 7/2003 | Maimon et al. | |
| 6,590,807 B2 | 7/2003 | Lowery | |
| 6,593,176 B2 | 7/2003 | Dennison | |
| 6,597,009 B2 | 7/2003 | Wicker | |
| 6,605,527 B2 | 8/2003 | Dennison et al. | |
| 6,613,604 B2 | 9/2003 | Maimon et al. | |
| 6,621,095 B2 | 9/2003 | Chiang et al. | |
| 6,625,054 B2 | 9/2003 | Lowery et al. | |
| 6,642,102 B2 | 11/2003 | Xu | |
| 6,646,297 B2 | 11/2003 | Dennison | |
| 6,649,928 B2 | 11/2003 | Dennison | |
| 6,667,900 B2 | 12/2003 | Lowery et al. | |
| 6,671,710 B2 | 12/2003 | Ovshinsky et al. | |
| 6,673,648 B2 | 1/2004 | Lowrey | |
| 6,673,700 B2 | 1/2004 | Dennison et al. | |
| 6,674,115 B2 | 1/2004 | Hudgens et al. | |
| 6,687,153 B2 | 2/2004 | Lowrey | |
| 6,687,427 B2 | 2/2004 | Ramalingam et al. | |
| 6,690,026 B2 | 2/2004 | Peterson | |
| 6,696,355 B2 | 2/2004 | Dennison | |
| 6,707,712 B2 | 3/2004 | Lowery | |
| 6,714,954 B2 | 3/2004 | Ovshinsky et al. | |
| 2002/0000666 A1 | 1/2002 | Kozicki et al. | |
| 2002/0031005 A1 * | 3/2002 | Natori et al. | 365/145 |
| 2002/0072188 A1 | 6/2002 | Gilton | |
| 2002/0106849 A1 | 8/2002 | Moore | |
| 2002/0123169 A1 | 9/2002 | Moore et al. | |
| 2002/0123170 A1 | 9/2002 | Moore et al. | |
| 2002/0123248 A1 | 9/2002 | Moore et al. | |
| 2002/0127886 A1 | 9/2002 | Moore et al. | |
| 2002/0132417 A1 | 9/2002 | Li | |
| 2002/0160551 A1 | 10/2002 | Harshfield | |
| 2002/0163828 A1 | 11/2002 | Krieger et al. | |
| 2002/0168820 A1 | 11/2002 | Kozicki et al. | |
| 2002/0168852 A1 | 11/2002 | Harshfield et al. | |
| 2002/0190289 A1 | 12/2002 | Harshfield et al. | |
| 2002/0190350 A1 | 12/2002 | Kozicki | |
| 2003/0001229 A1 | 1/2003 | Moore et al. | |
| 2003/0027416 A1 | 2/2003 | Moore | |
| 2003/0032254 A1 | 2/2003 | Gilton | |
| 2003/0035314 A1 | 2/2003 | Kozicki | |
| 2003/0035315 A1 | 2/2003 | Kozicki | |
| 2003/0038301 A1 | 2/2003 | Moore | |
| 2003/0043631 A1 | 3/2003 | Gilton et al. | |
| 2003/0045049 A1 | 3/2003 | Campbell et al. | |
| 2003/0045054 A1 | 3/2003 | Campbell et al. | |
| 2003/0047765 A1 | 3/2003 | Campbell | |
| 2003/0047772 A1 | 3/2003 | Li | |
| 2003/0047773 A1 | 3/2003 | Li | |
| 2003/0048519 A1 | 3/2003 | Kozicki | |
| 2003/0048744 A1 | 3/2003 | Ovshinsky et al. | |
| 2003/0049912 A1 | 3/2003 | Campbell et al. | |
| 2003/0052330 A1 * | 3/2003 | Klein | 257/154 |
| 2003/0068861 A1 | 4/2003 | Li | |
| 2003/0068862 A1 | 4/2003 | Li | |
| 2003/0095426 A1 | 5/2003 | Hush et al. | |
| 2003/0096497 A1 | 5/2003 | Moore et al. | |
| 2003/0107105 A1 | 6/2003 | Kozicki | |
| 2003/0117831 A1 | 6/2003 | Hush | |
| 2003/0128612 A1 | 7/2003 | Moore et al. | |
| 2003/0137869 A1 | 7/2003 | Kozicki | |
| 2003/0143782 A1 | 7/2003 | Gilton et al. | |
| 2003/0155589 A1 | 8/2003 | Campbell et al. | |
| 2003/0155606 A1 | 8/2003 | Campbell et al. | |
| 2003/0156447 A1 | 8/2003 | Kozicki | |
| 2003/0156463 A1 | 8/2003 | Casper et al. | |
| 2003/0209728 A1 | 11/2003 | Kozicki et al. | |
| 2003/0209971 A1 | 11/2003 | Kozicki et al. | |
| 2003/0210564 A1 | 11/2003 | Kozicki et al. | |
| 2003/0212724 A1 | 11/2003 | Ovshinsky et al. | |
| 2003/0212725 A1 | 11/2003 | Ovshinsky et al. | |
| 2004/0035401 A1 | 2/2004 | Ramachandran et al. | |

OTHER PUBLICATIONS

Huggett et al., *Development of silver sensitized germanium selenide photoresist by reactive sputter etching in $SF_6$*, 42 Appl. Phys. Lett., No. 7, pp. 592–594 (Apr. 1983).

Kawaguchi et al., *Mechanism of photosurface deposition*, 164–166 J. Non–Cryst. Solids, pp. 1231–1234 (1993).

Kolobov and Elliott, Photodoping of Amorphous Chalcogenides by Metals, Advances in Physics, vol. 40, No 5, 625–684 (1991).

Kozicki, et al., "Applications of Programmable Resistance Changes in Metal–doped Chalcogenides", Proceedings of the 1999 Symposium on Solid State Ionic Devices, Editors—E.D. Wachsman et al., The Electrochemical Society, Inc., 1–12 (1999).

Kozicki, et al., *Nanoscale effects in devices based on chalcogenide solid solutions*, Superlattices and Microstructures, 27, 485–488 (2000).

Kozicki, et al., *Nanoscale phase separation in Ag–Ge–Se glasses*, Microelectronic Engineeering, vol. 63/1–3, 155–159 (2002).

M.N. Kozicki and M. Mitkova, *Silver Incorporation in thin films of selenium rich Ge–Se glasses*, Proceedings of the XIX International Congress on Glass, Society for Glass Technology, 226–227 (2001).

McHardy et al., *The dissolution of metals in amorphous chalcogenides and the effects o electron and ultraviolet radiation*, 20 J. Phys. C.: Solid State Phys., pp. 4055–4075 (1987)f.

Owen et al., *Metal–Chalcogenide Photoresists for High Resolution Lithography and Sub–Micron Structures*, Nanostructure Physics and Fabrication, pp. 447–451 (M. Reed ed. 1989).

Shimizu et al., *The Photo–Erasable Memory Switching Effect of Ag Photo–Doped Chalcogenide Glasses*, 46 B. Chem. Soc. Japan, No. 12, pp. 3662–3365 (1973).

Abdel–All, A.; Elshafie,A.; Elhawary, M.M., DC electric–field effect in bulk and thin–film Ge5As38Te57 chalcogenide glass, Vacuum 59 (2000) 845–853.

Adler, D.; Moss, S.C., Amorphous memories and bistable switches, J. Vac. Sci. Technol. 9 (1972) 1182–1189.

Adler, D.; Henisch, H.K.; Mott, S.N., The mechanism of threshold switching in amorphous alloys, Rev. Mod. Phys. 50 (1978) 209–220.

Afifi, M.A.; Labib, H.H.; El–Fazary, M.H.; Fadel, M., Electrical and thermal properties of chalcogenide glass system Se75Ge25–xSbx, Appl. Phys. A 55 (1992) 167–169.

Afifi,M.A.; Labib, H.H.; Fouad, S.S.; El–Shazly, A.A., Electrical & thermal conductivity of the amorphous semiconductor GexSe1–x, Egypt, J. Phys. 17 (1986) 335–342.

Alekperova, Sh.M.; Gadzhieva, G.S., Current–Voltage characteristics of Ag2Se single crystal near the phase transition, Inorganic Materials 23 (1987) 137–139.

Aleksiejunas, A.; Cesnys, A., Switching phenomenon and memory effect in thin–film heterojunction of polycrystalline selenium–silver selenide, Phys. Stat. Sol. (a) 19 (1973) K169–K171.

Angell, C.A., Mobile ions in amorphous solids, Annu. Rev. Phys. Chem. 43 (1992) 693–717.

Aniya, M., Average electronegativity, medium–range–order, and ionic conductivity in superionic glasses, Solid state Ionics 136–137 (2000) 1085–1089.

Asahara, Y.; Izumitani, T., Voltage controlled switching in Cu–As–Se compositions, J. Non–Cryst. Solids 11 (1972) 97–104.

Asokan, S.; Prasad, M.V.N.; Parthasarathy, G.; Gopal, E.S.R., Mechanical and chemical thresholds in IV–VI chalcogenide glasses, Phys. Rev. Lett. 62 (1989) 808–810.

Baranovskii, S.D.; Cordes, H., On the conduction mechanism in ionic glasses, J. Chem. Phys. 111 (1999) 7546–7557.

Belin, R.; Taillades, G.; Pradel, A.; Ribes, M., Ion dynamics in superionic chalcogenide glasses: complete conductivity spectra, Solid state Ionics 136–137 (2000) 1025–1029.

Belin, R.; Zerouale, A.; Pradel, A.; Ribes, M., Ion dynamics in the argyrodite compound Ag7GeSe5I: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M–Ag2Se–M, Thin solid films 70 (1980) L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sol. (a) 57 (1980) K101–K104.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165–171.

Bernede, J.C.; Khelil, A.; Keltaf, M.; Conan, A., Transition from S– to N–type differential negative resistance in Al–Al2O3–Ag2-xSe1+x thin film structures, Phys. Stat. Sol. (a) 74 (1982) 217–224.

Bondarev, V.N.; Pikhitsa, P.V., A dendrite model of current instability in RbAg4I5, Solid State Ionics 70/71 (1994) 72–76.

Boolchand, P., The maximum in glass transition temperature (Tg) near x=1/3 in GexSe1-x Glasses, Asian Journal of Physics (2000) 9, 709–72.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweiler, R.N.; Tenhover, M., Structural ordering of evaporated amorphous chalcogenide alloy films: role of thermal annealing, Diffusion and Defect Data vol. 53–54 (1987) 415–420.

Boolchand, P.; Grothaus, J.; Bresser, W.J.; Suranyi, P. Structural origin of broken chemical order in a GeSe2 glass, Phys. Rev. B 25 (1982) 2975–2978.

Boolchand, P.; Grothaus, J.; Phillips, J.C., Broken chemical order and phase separation in GexSe1-x glasses, Solid state comm. 45 (1983) 183–185.

Boolchand, P.; Bresser, W.J., Compositional trends in glass transition temperature (Tg), network connectivity and nanoscale chemical phase separation in chalcogenides, Dept. of ECECS, Univ. Cincinnati (Oct. 28, 1999) 45221–0030.

Boolchand, P.; Grothaus, J, Molecular Structure of Melt-Quenched GeSe2 and GeS2 glasses compared, Proc. Int. Conf. Phys. Semicond. (Eds. Chadi and Harrison) $17^{th}$ (1985) 833–36.

Bresser, W.; Boolchand, P.; Suranyi, P., Rigidity percolation and molecular clustering in network glasses, Phys. Rev. Lett. 56 (1986) 2493–2496.

Bresser, W.J.; Boolchand, P.; Suranyi, P.; de Neufville, J.P, Intrinsically broken chalcogen chemical order in stoichiometric glasses, Journal de Physique 42 (1981) C4–193–C4–196.

Bresser, W.J.; Boolchand, P.; Suranyi, P.; Hernandez, J.G., Molecular phase separation and cluster size in GeSe2 glass, Hyperfine Interactions 27 (1986) 389–392.

Cahen, D.; Gilet, J.–M.; Schmitz, C.; Chemyak, L.; Gartsman, K.; Jakubowicz, A., Room–Temperature, electric field induced creation of stable devices in CuInSe2 Crystals, Science 258 (1992) 271–274.

Chatterjee, R.; Asokan, s.; Titus, S.S.K., Current–controlled negative–resistance behavior and memory switching in bulk As–Te–Se glasses, J. Phys. D: Appl. Phys. 27 (1994) 2624–2627.

Chen, C.H.; Tai, K.L. , Whisker growth induced by Ag photodoping in glassy GexSe1-x films, Appl. Phys. Lett. 37 (1980) 1075–1077.

Chen, G.; Cheng, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of Si3N4 on chemical durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300K, J. Appl. Phys. 38 (1967) 753–756.

Davis, E.A., Semiconductors without form, Search 1 (1970) 152–155.

Dearnaley, G.; Stoneham, A.M.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L., Structure of Vitreous Ag–Ge–Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous silicon/nanodisperse metal (SIMAL) system–Films of unique electronic properties, J. Non–Cryst. Solids 198–200 (1996) 829–832.

El Bouchairi, B.; Bernede, J.C.; Burgaud, P., Properties of Ag2–xSe1+x/n–Si diodes, Thin Solid Films 110 (1983) 107–113.

El Gharras, Z.; Bourahla, A.; Vautier, C., Role of photoinduced defects in amorphous GexSe1–x photoconductivity, J. Non–Cryst. Solids 155 (1993) 171–179.

El Ghrandi, R.; Calas, J.; Galibert, G.; Averous, M., Silver photodissolution in amorphous chalcogenide thin films, Thin Solid Films 218 (1992)259–273.

El Ghandri, R.; Calas, J.; Galibert, G., Ag dissolution kinetics in amorphous GeSe5.5 thin films from "in–situ" resistance measurements vs time, Phys. Stat. Sol. (a) 123 (1991) 451–460.

El–kady, Y.L., The threshold switching in semiconducting glass Ge21Se17Te62, Indian J. Phys. 70A (1996) 507–516.

Elliott, S.R., A unified mechanism for metal photodissolution in amorphous chalcogenide materials, J. Non–Cryst. Solids 130 (1991) 85–97.

Elliott, S.R., Photodissolution of metals in chalcogenide glasses: A unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El–Zahed, H.; El–Korashy, A., Influence of composition on the electrical and optical properties of Ge20BixSe80–x films, Thin Solid Films 376 (2000) 236–240.

Fadel, M., Switching phenomenon in evaporated Se–Ge–As thin films of amorphous chalcogenide glass, Vacuum 44 (1993) 851–855.

Fadel, M.; El–Shair, H.T., Electrical, thermal and optical properties of Se75Ge7Sb18, Vacuum 43 (1992) 253–257.

Feng, X. ;Bresser, W.J.; Boolchand, P., Direct evidence for stiffness threshold in Chalcogenide glasses, Phys. Rev. Lett. 78 (1997) 4422–4425.

Feng, X.; Bresser, W.J.; Zhang, M.; Goodman, B.; Boolchand, P., Role of network connectivity on the elastic, plastic and thermal behavior of covalent glasses, J. Non–Cryst. Solids 222 (1997) 137–143.

Fischer–Colbrie, A.; Bienenstock, A.; Fuoss, P.H.; Marcus, M.A., Structure and bonding in photodiffused amorphous Ag–GeSe2 thin films, Phys. Rev. B 38 (1988) 12388–12403.

Fleury, G.; Hamou, A.; Viger, C.; Vautier, C., Conductivity and crystallization of amorphous selenium, Phys. Stat. Sol. (a) 64 (1981) 311–316.

Fritzsche, H, Optical and electrical energy gaps in amorphous semiconductors, J. Non–Cryst. Solids (1971) 49–71.

Fritzsche, H., Electronic phenomena in amorphous semiconductors, Annual Review of Materials Science 2 (1972) 697–744.

Gates, B.; Wu, Y.; Yin, Y.; Yang, P.; Xia, Y., Single–crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013–1018.

Guin, J.–P.; Rouxel, T.; Keryvin, V.; Sangleboeuf, J.–C.; Serre, I.; Lucas, J., Indentation creep of Ge–Se chalcogenide glasses below Tg: elastic recovery and non–Newtonian flow, J. Non–Cryst. Solids 298 (2002) 260–269.

Guin, J.–P.; Rouxel, T.; Sangleboeuf, J.–C; Melscoet, I.; Lucas, J., Hardness, toughness, and scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the structure and electrical properties of As–Se–Cu glasses, J. Apply. Phys. 54 (1983) 1950–1954.

Hajto, J.; Rose, M.J.; Osborne, I.S.; Snell, A.J.; Le Comber, P.G.; Owen, A.E., Quantization effects in metal/a–Si:H/metal devices, Int. J. Electronics 73 (1992) 911–913.

Hajto, J.; Hu, J.; Snell, A.J.; Turvey, K.; Rose, M., DC and AC measurements on metal/a–Si:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal–a–Si:H–metal thin film structures, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan, H., Polarized memory switching in amorphous Se film, Japan. J. Appl. Phys. 13 (1974) 1163–1164.

Hegab, N.A.; Fadel, M.; Sedeek, K., Memory switching phenomena in thin films of chalcogenide semiconductors, Vacuum 45 (1994) 459–462.

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy GexSe1–x around the stiffness threshold composition, J. Optoelectronics and Advanced Materials 3 (2001) 199–214.

Hu, J.; Snell, A.J.; Hajto, J.; Owen, A.E., Constant current forming in Cr/p+a–/Si:H/V thin film devices, J. Non–Cryst. Solids 227–230 (1998) 1187–1191.

Hu, J.; Hajto, J.; Snell, A.J.; Owen, A.E.; Rose, M.J., Capacitance anomaly near the metal–non–metal transition in Cr–hydrogenated amorphous Si–V thin–film devices, Phil. Mag. B. 74 (1996) 37–50.

Hu, J.; Snell, A.J.; Hajto, J.; Owen, A.E., Current–induced instability in Cr–p+a–Si:H–V thin film devices, Phil. Mag. B 80 (2000) 29–43.

Iizima, S.; Sugi, M.; Kikuchi, M.; Tanaka, K., Electrical and thermal properties of semiconducting glasses AS–Te–Ge, Solid State Comm. 8 (1970) 153–155.

Ishikawa, R.; Kikuchi, M., Photovoltaic study on the photo–enhanced diffusion of Ag in amorphous films of Ge2S3, J. Non–Cryst. Solids 35 & 36 (1980) 1061–1066.

Iyetomi, H.; Vashishta, P.; Kalia, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joulie, A.M.; Marucchi, J., On the DC electrical conduction of amorphous As2Se7 before switching, Phys. Stat. Sol. (a) 13 (1972) K105–K109.

Joulie, A.M.; Marucchi, J., Electrical properties of the amorphous alloy As2Se5, Mat. Res. Bull. 8 (1973) 433–442.

Kaplan, T.; Adler, D., Electrothermal switching in amorphous semiconductors, J. Non–Cryst. Solids 8–10 (1972) 538–543.

Kawaguchi, T.; Maruno, S.; Elliott, S.R., Optical, electrical, and structural properties of amorphous Ag–Ge–S and Ag–Ge–Se films and comparison of photoinduced and thermally induced phenomena of both systems, J. Appl. Phys. 79 (1996) 9096–9104.

Kawaguchi, T.; Masui, K., Analysis of change in optical transmission spectra resulting from Ag photodoping in chalcogenide film, Japn. J. Appl. Phys. 26 (1987) 15–21.

Kawasaki, M.; Kawamura, J.; Nakamura, Y.; Aniya, M., Ionic conductivity of Agx(GeSe3)1–x (0<=x<=0.571) glasses, Solid state Ionics 123 (1999) 259–269.

Kluge, G.; Thomas, A.; Klabes, R.; Grotzschel, R., Silver photodiffusion in amorphous GexSe100–x, J. Non–Cryst. Solids 124 (1990) 186–193.

Kolobov, A.V., On the origin of p–type conductivity in amorphous chalcogenides, J. Non–Cryst. Solids 198–200 (1996) 728–731.

Kolobov, A.V., Lateral diffusion of silver in vitreous chalcogenide films, J. Non–Cryst. Solids 137–138 (1991) 1027–1030.

Korkinova, Ts.N.; Andreichin,R.E., Chalcogenide glass polarization and the type of contacts, J. Non–Cryst. Solids 194 (1996) 256–259.

Kotkata, M.F.; Afif, M.A.; Labib, H.H.; Hegab, N.A.; Abdel–Aziz, M.M., Memory switching in amorphous GeSeTl chalcogenide semiconductor films, Thin Solid Films 240 (1994) 143–146.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16–19.

Lal, M.; Goyal, N., Chemical bond approach to study the memory and threshold switching chalcogenide glasses, Indian Journal of pure & appl. phys. 29 (1991) 303–304.

Leimer, F.; Stotzel, H.; Kottwitz, A., Isothermal electrical polarisation of amorphous GeSe films with blocking Al contacts influenced by Poole–Frenkel conduction, Phys. Stat. Sol. (a) 29 (1975) K129–K132.

Leung, W.; Cheung, N.; Neureuther, A.R., Photoinduced diffusion of Ag in GexSe1–x glass, Appl. Phys. Lett. 46 (1985) 543–545.

Matsushita, T.; Yamagami, T.; Okuda, M., Polarized memory effect observed on Se–SnO2 system, Jap. J. Appl. Phys. 11 (1972) 1657–1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2–V2O5 based glasses, Journal de Physique IV 2 (1992) C2–185–C2–188.

Messoussi, R.; Bernede, J.C.; Benhida, S.; Abachi, T.; Latef, A., Electrical characterization of M/Se structures (M=Ni, Bi), Mat. Chem. And Phys. 28 (1991) 253–258.

Mitkova, M.; Boolchand, P., Microscopic origin of the glass forming tendency in chalcogenides and constraint theory, J. Non–Cryst. Solids 240 (1998) 1–21.

Mitkova, M.; Kozicki, M.N., Silver incorporation in Ge–Se glasses used in programmable metallization cell devices, J. Non–Cryst. Solids 299–302 (2002) 1023–1027.

Miyatani, S.–y., Electronic and ionic conduction in (AgxCu1–x)2Se, J. Phys. Soc. Japan 34 (1973) 423–432.

Miyatani, S.–y., Electrical properties of Ag2Se, J. Phys. Soc. Japan 13 (1958) 317.

Miyatani, S.–y., Ionic conduction in beta–Ag2Te and beta–Ag2Se, Journal Phys. Soc. Japan 14 (1959) 996–1002.

Mott, N.F., Conduction in glasses containing transistion metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564–569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of GexSe1–x amorphous thin films, Jap. J. App. Phys. 15 (1976) 849–853.

Narayanan, R.A.; Asokan, S.; Kumar, A., Evidence concerning the effect of topology on electrical switching in chalcogenide network glasses, Phys. Rev. B 54 (1996) 4413–4415.

Neale, R.G.; Aseltine, J.A., The application of amorphous materials to computer memories, IEEE transactions on electron dev. Ed–20 (1973) 195–209.

Ovshinsky S.R.; Fritzsche, H., Reversible structural transformations in amorphous semiconductors for memory and logic, Metallurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., Photo–induced structural and physico–chemical changes in amorphous chalcogenide semiconductors, Phil. Mag. B 52 (1985) 347–362.

Owen, A.E.; Le Comber, P.G.; Hajto, J.; Rose, M.J.; Snell, A.J., Switching in amorphous devices, Int. J. Electronics 73 (1992) 897–906.

Pearson, A.D., Miller, C.E., Filamentary conduction in semiconducting glass diodes, App. Phys. Lett. 14 (1969) 280–282.

Pinto, R.; Ramanathan, K.V., Electric field induced memory switching in thin films of the chalcogenide system Ge–As–Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I.; Geller, I.KH.; Shemetova, V.K., Memory and threshold switching effects in amorphous selenium, Phys. Stat. Sol. (a) 44 (1977) K71–K73.

Prakash, S.; Asokan, S.; Ghare, D.B., Easily reversible memory switching in Ge–As–Te glasses, J. Phys. D: Appl. Phys. 29 (1996) 2004–2008.

Rahman, S.; Sivarama Sastry, G., Electronic switching in Ge–Bi–Se–Te glasses, Mat. Sci. and Eng. B12 (1992) 219–222.

Ramesh, K.; Asokan, S.; Sangunni, K.S., Gopal, E.S.R., Electrical Switching in germanium telluride glasses doped with Cu and Ag, Appl. Phys. A 69 (1999) 421–425.

Rose,M.J.;Hajto,J.;Lecomber,P.G.;Gage,S.M.;Choi,W.K-.;Snell,A.J.;Owen,A.E., Amorphous silicon analogue memory devices, J. Non–Cryst. Solids 115 (1989) 168–170.

Rose,M.J.;Snell,A.J.;Lecomber,P.G.;Hajto,J.;Fitzgerald, A.G.;Owen,A.E., Aspects of non–volatility in a –Si:H memory devices, Mat. Res. Soc. Symp. Proc. V 258, 1992, 1075–1080.

Schuocker, D.; Rieder, G., On the reliability of amorphous chalcogenide switching devices, J. Non–Cryst. Solids 29 (1978) 397–407.

Sharma, A.K.; Singh, B., Electrical conductivity measurements of evaporated selenium films in vacuum, Proc. Indian Natn. Sci. Acad. 46, A, (1980) 362–368.

Sharma, P. Structural, electrical and optical properties of silver selenide films, Ind. J. Of pure and applied phys. 35 (1997) 424–427.

Snell, A.J.; Lecomber, P.G.; Hajto, J.; Rose, M.J.; Owen, A.E.; Osborne, I.L., Analogue memory effects in metal/a–Si:H/metal memory devices, J. Non–Cryst. Solids 137–138 (1991) 1257–1262.

Snell, A.J.; Hajto, J.;Rose, M.J.; Osborne, L.S.; Holmes, A.; Owen, A.E.; Gibson, R.A.G., Analogue memory effects in metal/a–Si:H/metal thin film structures, Mat. Res. Soc. Symp. Proc. V 297, 1993, 1017–1021.

Steventon, A.G., Microfilaments in amorphous chalcogenide memory devices, J. Phys. D: Appl. Phys. 8 (1975) L120–L122.

Steventon, A.G., The switching mechanisms in amorphous chalcogenide memory devices, J. Non–Cryst. Solids 21 (1976) 319–329.

Stocker, H.J., Bulk and thin film switching and memory effects in semiconducting chalcogenide glasses, App. Phys. Lett. 15 (1969) 55–57.

Tanaka, K., Ionic and mixed conductions in Ag photodoping process, Mod. Phys. Lett B 4 (1990) 1373–1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type I amorphous chalcogenide, J. Elect. Mat. 2 (1973) 3–15.

Thornburg, D.D., Memory switching in amorphous arsenic triselenide, J. Non–Cryst. Solids 11 (1972) 113–120.

Thornburg, D.D.; White, R.M., Electric field enhanced phase separation and memory switching in amorphous arsenic triselenide, Journal(??) (1972) 4609–4612.

Tichy, L.; Ticha, H., Remark on the glass–forming ability in GexSe1–x and AsxSe1–x systems, J. Non–Cryst. Solids 261 (2000) 277–281.

Titus, S.S.K.; Chatterjee, R.; Asokan, S., Electrical switching and short–range order in As–Te glasses, Phys. Rev. B 48 (1993) 14650–14652.

Tranchant,S.;Peytavin,S.;Ribes,M.;Flank,A.M.;Dexpert, H.;Lagarde,J.P., Silver chalcogenide glasses Ag–Ge–Se: Ionic conduction and exafs structural investigation, Transport–structure relations in fast ion and mixed conductors Proceedings of the 6th Riso International symposium, Sep. 9–13, 1985.

Tregouet, Y.; Bernede, J.C., Silver movements in Ag2Te thin films: switching and memory effects, Thin Solid Films 57 (1979) 49–54.

Uemura, O.; Kameda, Y.; Kokai, S.; Satow, T., Thermally induced crystallization of amorphous Ge0.4Se0.6, J. Non–Cryst. Solids 117–118 (1990) 219–221.

Uttecht, R.; Stevenson, H.; Sie, C.H.; Griener, J.D.; Raghavan, K.S., Electric field induced filament formation in As–Te–Ge glass, J. Non–Cryst. Solids 2 (1970) 358–370.

Viger, C.; Lefrancois, G.; Fleury, G., Anomalous behavior of amorphous selenium films, J. Non–Cryst. Solids 33 (1976) 267–272.

Vodenicharov, C.; Parvanov,S.; Petkov,P., Electrode–limited currents in the thin–film M–GeSe–M system, Mat. Chem. And Phys. 21 (1989) 447–454.

Wang, S.–J.; Misium, G.R.; Camp, J.C.; Chen, K.–L.; Tigelaar, H.L., High–performance Metal/silicide antifuse, IEEE electron dev. Lett. 13 (1992)471–472.

Weirauch, D.F., Threshold switching and thermal filaments in amorphous semiconductors, App. Phys. Lett. 16 (1970) 72–73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971–2974.

West, W.C., Electrically erasable non–volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non–Cryst. Solids 151 (1992) 149–154.

P. Boolchand, et al., "Mobile Silver Ions and Glass Formation in Solid Electrolytes" *Nature*, vol. 410, Apr. 2001, pp. 1070–1073.

Y. Hirose, et al., "High Speed Memory Behavior and Reliability of an Amorphous As2S3 Film Doped With Ag" *Physica Status Solidi* vol. (a), No. 16, (1980) K187–K190.

Y. Hirose, et al., "Polarity–Dependent Memory Switching and Behavior of Ag Dendrite in Ag–Photodoped Amorphous As2–s3 Films" *J. Appl. Phys.* vol. 47, No. 6, Jun. 1976 pp. 2767–2772.

A. V. Kotobov, et al., "Photodoping of Amorphous Chalcogenides by Metals" *Advances in Physics* 1991, vol. 40, No. 5, pp. 625–684.

M. Mitkova, et al., "Dual Chemical Role of Ag as an Additive in Chalcogenide Glasses" *Physical Review Letters* vol. 83, No. 19, pp. 3748–3851.

K. L. Tai, et al., "Bilevel High Resolution Photolithographic Technique For Use With Wafers Stepped and/or Reflecting Surfaces" *J. Vac. Sci. Technol.* vol. 16, No. 6, Nov./Dec. 1979 pp. 1977–1979.

K. L. Tai, et al., "Inorganic Resist Systems for VLSI Microlithography" pp. 9–35.

K. L. Tai, et al., "Submicron Optical Lithography Using an Inorganic Resist/Polymer Bilevel Scheme" *J. Vac. Sci. Technol.* vol. 17, No. 5, Sep./Oct. 1980 pp. 1169–1176.

A. Yoshikawa, et al., "Angstroms Resolution in Se–Ge Inorganic Photoresists" *Japanese Journal of Applied Physics* vol. 20, No. 2, Feb. 1981, pp. L81–L83.

A. Yoshikawa, et al., "Dry Development of Se–Ge Inorganic Photoresist" *Appl. Phys. Lett.* vol. 36, No. 1, Jan. 1980, pp. 107–109.

A. Yoshikawa, et al., "A New Inorganic Electron Resist of High Contrast" *Appl. Phys. Lett.* vol. 31, No. 3, Aug. 1977, pp. 161–163.

A. Yoshikawa, et al., "A Novel Inorganic Photoresist Utilizing Ag Photodoping In Se–Ge Glass Films" *Appl. Phys. Lett.* vol. 29, No. 10, Nov. 15, 1976, pp. 677–679.

* cited by examiner

US 6,858,482 B2

METHOD OF MANUFACTURE OF PROGRAMMABLE SWITCHING CIRCUITS AND MEMORY CELLS EMPLOYING A GLASS LAYER

BACKGROUND OF THE INVENTION

1. Field of the Invention

This invention relates generally to a method of manufacture of memory devices for integrated circuits and more particularly to programmable conductor memory arrays comprising glass electrolyte elements.

2. Description of the Related Art

The digital memory most commonly used in computers and computer system components is the dynamic random access memory (DRAM), wherein voltage stored in capacitors represents digital bits of information. Electric power must be supplied to the capacitors to maintain the information because, without frequent refresh cycles, the stored charge dissipates, and the information is lost. Memories that require constant power are known as volatile memories.

Non-volatile memories do not need frequent refresh cycles to preserve their stored information, so they consume less power than volatile memories. The information stays in the memory even when the power is turned off. There are many applications where non-volatile memories are preferred or required, such as in laptop and palm-top computers, cell phones or control systems of automobiles. Non-volatile memories include magnetic random access memories (MRAMs), erasable programmable read only memories (EPROMs) and variations thereof.

Another type of non-volatile memory is the programmable conductor or programmable metallization memory cell, which is described by Kozicki et al. in (U.S. Pat. No. 5,761,115; No. 5,914,893; and No. 6,084,796), which are incorporated herein by reference. The programmable conductor cell of Kozicki et al. (also referred to by Kozicki et al. as a "metal dendrite memory") comprises a glass ion conductor, such as a chalcogenide-metal ion glass and a plurality of electrodes disposed at the surface of the fast ion conductor and spaced a distance apart from on another. The glass/ion element shall be referred to herein as a "glass electrolyte," or, more generally, "cell body." When a voltage is applied to the anode and the cathode, a non-volatile conductive pathway (considered a sidewall "dendrite" by Kozicki et al.) grows from the cathode through or along the cell body towards the anode. The growth of the dendrite depends upon applied voltage and time; the higher the voltage, the faster the growth rate; and the longer the time, the longer the dendrite. The dendrite stops growing when the voltage is removed. The dendrite shrinks, re-dissolving metal ions into the cell body, when the voltage polarity is reversed.

In the case of a dielectric material, programmable capacitance between electrodes are programmed by the extent of dendrite growth. In the case of resistive material, programmable resistances are also programmed in accordance with the extent of dendrite growth. The resistance or capacitance of the cell thus changes with changing dendrite length. By completely shorting the glass electrolyte, the metal dendrite can cause a radical change in current flow through the cell, defining a different memory state.

The recent trends in memory arrays generally have been to form first a via, then fill it with a memory storage element (e.g., capacitor) and etch back. It is simple to isolate individual memory cells in this way. Programmable memory cells have been fabricated also using a container configuration, wherein the electrodes and body layers are deposited into a via etched into an insulating layer. The dendrites were believed by Kozicki et al. to grow along the interface between the cell and the via wall. Typically, the memory cell is formed in an array having a conventional DRAM-type circuit design. For example, in a conventional cross-point circuit design, memory elements are formed between upper and lower conductive lines at intersections. Typically, a via is formed in an insulating layer and filled with the memory element, such as a glass electrolyte or glass fast ion diffusion (GFID) element.

Heretofore known structures for PMC memory arrays are rather limiting. For example, it has often been found difficult to deposit component films for a PMC device to fill small vias. Accordingly, a need exists for novel methods and structures for exploiting the potential of PMC technology.

Accordingly, a need exists for improved methods and structures for forming integrated programmable conductor memory arrays.

SUMMARY OF THE INVENTION

In accordance with one aspect of the invention, a method is provided for fabricating programmable conductor memory cells on a substrate using blanket deposition of layers. The fabrication method comprises forming a bottom electrode in contact with a conductive region in a semiconductor base material, providing a glass electrolyte layer having metal ions diffused therein and being capable of growing conductive pathway(s) therethrough under the influence of an applied voltage and forming a top electrode layer. Subsequently, the top electrode layer, the glass electrolyte layer and the bottom electrode are patterned and etched to define separate pillars or cells of stacked materials.

In a preferred embodiment, a liner layer of an insulating material that conforms to the cells and the semiconductor base material is deposited over the cells. This liner layer acts as a barrier to prevent diffusion of the metal away from the cell. Remaining regions between the cells are filled with an insulating layer. At least some of the insulating layer and some of the liner layer are removed to make contact to the top electrode layer of the cell and to the substrate.

In accordance with another aspect of the invention, a memory array structure is described wherein each programmable conductor memory cell or pillar comprises a bottom electrode, a cell body formed of a glass electrolyte layer having metal ions diffused therein and a top electrode.

BRIEF DESCRIPTION OF THE DRAWINGS

These and other aspects of the invention will be better understood in view of the detailed description below and the appended drawings, which are meant to illustrate and not to limit the invention, and in which.

3, after deposition of a layer of insulating material to fill the spaces around them.

Figure 4A:
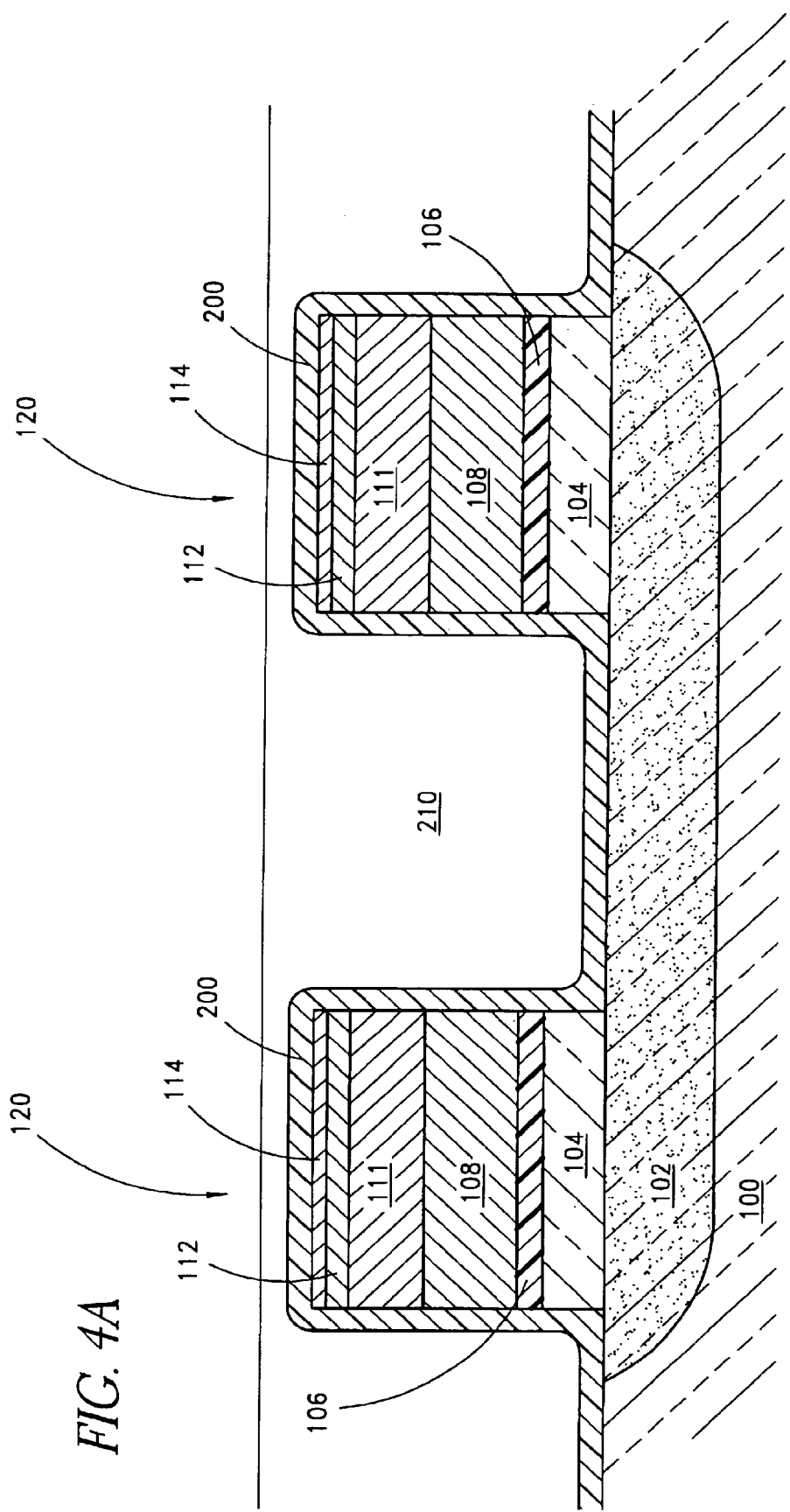
FIG. 4A is a schematic cross-section of two cells in an array of programmable memory cells, similar to that of FIG.
Figure 4B:
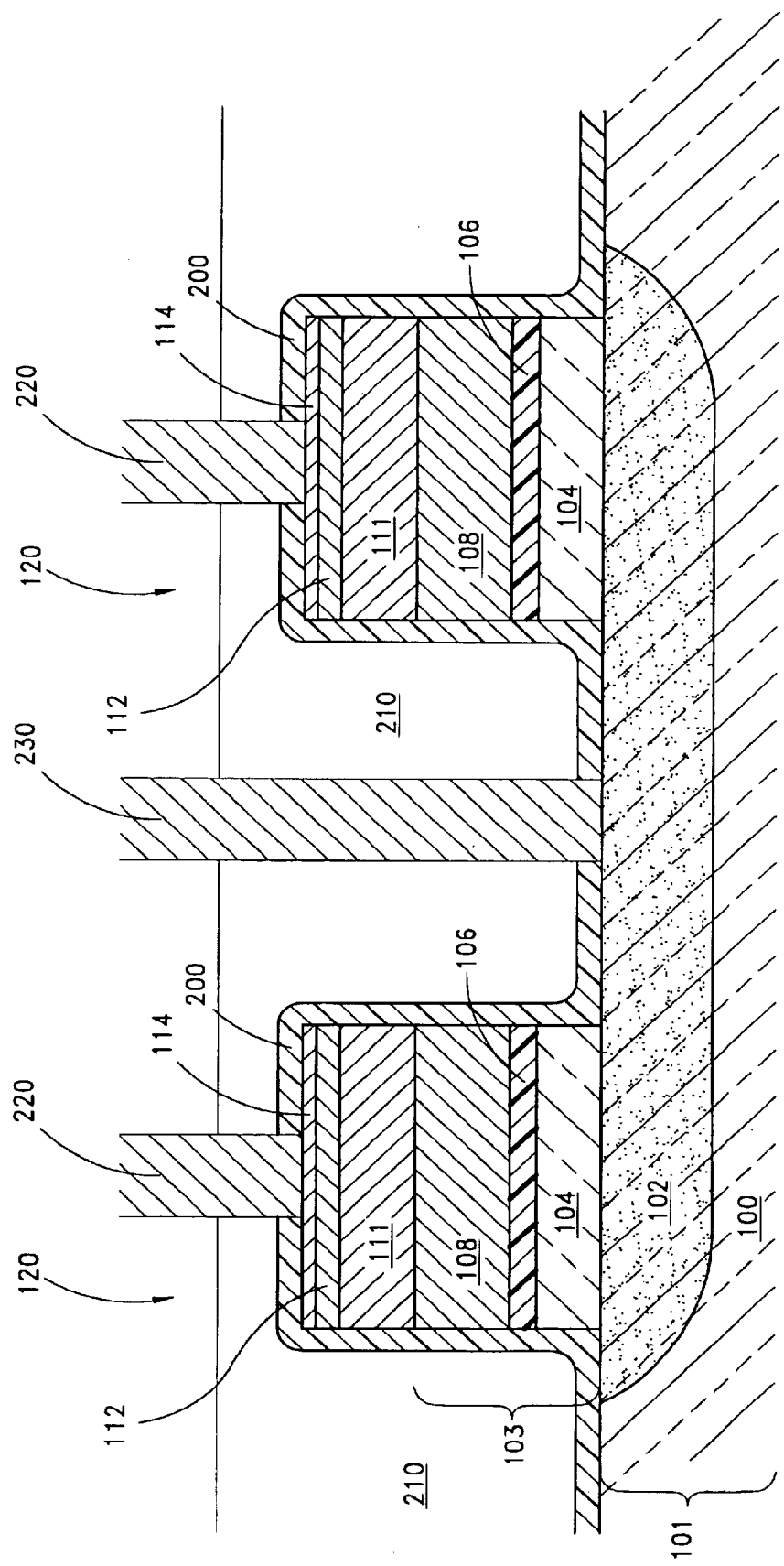

FIG. 4B is a schematic cross-section of the cells of FIG. 4A after electrical contacts to the electrodes of the cells have been made.

DETAILED DESCRIPTION OF THE PREFERRED EMBODIMENT

The preferred embodiment discloses a method of fabricating a programmable memory cell in a stud configuration. Blanket layers of electrode and body materials are deposited and subsequently patterned and etched, leaving pillars or studs as individual devices. The blanket deposition of the layers avoids problems associated with via filling and allows more flexibility in cell configuration.

Figure 1:
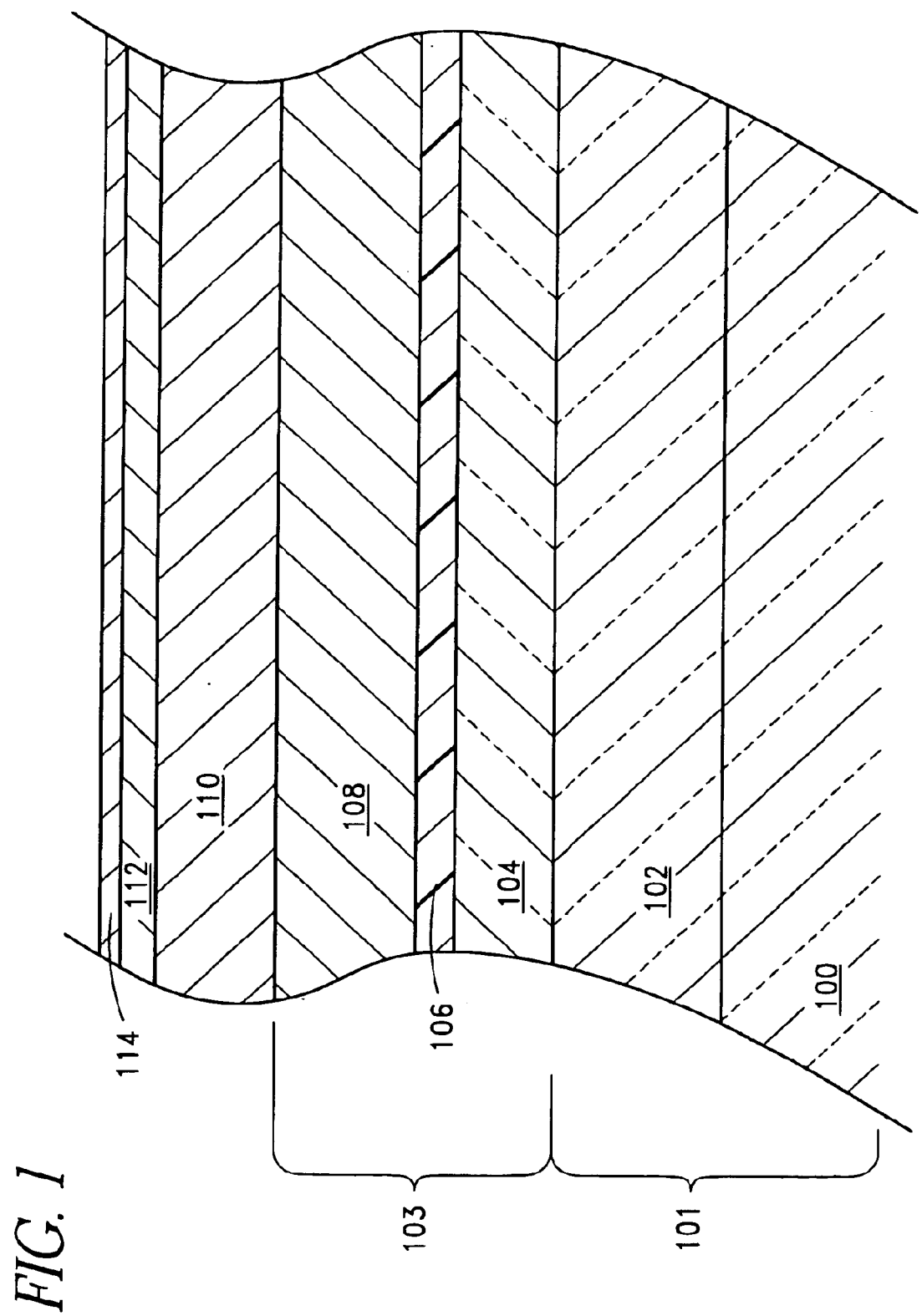
FIG. 1 is a schematic cross-section of a partially fabricated integrated circuit, showing blanket layers deposited on a semiconductor substrate according to a preferred embodiment of the present invention.

With reference to FIG. 1, a cross section of deposited blanket layers is shown. A semiconductor base material 100 containing a heavily doped (e.g., n$^+$) conductive region 102 comprises the substrate 101 upon which the memory cells are fabricated. In general, the substrate comprises the lowest layer of semiconductor material from which devices are formed in the integrated circuit. In the illustrated embodiments, the substrate comprises a single-crystal silicon wafer. In other arrangements, an epitaxial silicon layer or another semiconductor, such as a III–V material, can be used.

A bottom electrode 103 makes contact with the substrate. The bottom electrode 103 can include more than one layer. In the illustrated embodiment the bottom electrode 103 comprises a layer of polysilicon 104, a layer of tungsten nitride 106 and a layer of tungsten 108. Preferably, the polysilicon layer 104 is between about 25 nm and 75 nm thick, the tungsten nitride layer 106 is between about 5 nm and 40 nm thick and the tungsten layer 108 is between about 50 nm and 100 nm thick.

The body 110 of the programmable memory cell is deposited over the electrode 103. The memory cell body 110 comprises a glass material, preferably a chalcogenide glass selected from the group consisting of sulfur, germanium, selenium and tellurium, more preferably a glass comprising germanium (Ge) and selenium (Se), in which the ratio of Ge:Se can vary (e.g., $Ge_4Se_6$, $Ge_3Se_7$ or $Ge_2Se_8$) but is preferably targeted for about $Ge_{25}Se_{75}$). The thickness of the germanium selenide layer is preferably between about 25 nm and 75 nm, with a target thickness of about 50 nm in the illustrated embodiment. Preferred methods of depositing the Ge—Se material include sputtering and evaporation. More complicated structures for the cell body are also contemplated, as discussed below.

A metal film (not shown) is deposited over the memory cell body 110 as a source of metal ions for diffusion into the memory cell body. Preferably, the metal film includes a metal from Group B or Group IIB (e.g., silver, copper or zinc), and more preferably the metal is silver. Alternatively, the metal film may be co-sputtered tungsten-silver. Energy is provided to diffuse metal from the film into the memory cell body 110, preferably by photodissolution, a self-limiting reaction. Take, for example, a silver layer of 30 nm over a Ge—Se layer 110 of 50 nm, exposed to ultraviolet radiation, particularly ultraviolet radiation with a wavelength of less than 500 nm at about 4 mW/cm$^2$ for about 15 min. Sufficient silver dissolves into the glass layer 110 to saturate the glass by forming a glass electrolyte ternary compound with about 30 atomic percent silver. It is preferred that there be some silver film left over the cell body 110 after the diffusion occurs. In one example, the 50-nm layer of Ge—Se consumes about 15 nm of silver, leaving a film 112 of about 15 nm over the memory cell body after the photodissolution reaction.

In other arrangement, metal for the programmable conductor memory cell body is supplied by other means. For example, the metal and glass material can be co-sputtered or deposited from a source that contains all species, so no metal deposition and drive-in steps are needed. This fast ion conducting element with metal ions diffused therein will be referred to herein as the memory cell body 110.

In still other arrangements, the cell body 110 can include multiple layers. For example, the cell body 110 in one embodiment includes a first Ge—Se layer (e.g., $Ge_4Se_6$), a metal selenide layer (e.g., $Ag_2Se$) thereover, and a second Ge—Se layer (e.g., $Ge_4Se_6$) over the metal selenide layer. The skilled artisan will appreciate that the embodiments discussed below are equally applicable to any of a variety of other programmable conductor arrangements. In the Ge—Se/metal selenide/Ge—Se sandwich structure described in this paragraph, the intermediate metal selenide layer provides metal to the cell body 110 for formation of conductive pathways under the influence of applied electrical fields.

After dissolution, if used, an additional silver layer 112 may be deposited particularly if the original silver layer was fully consumed in the dissolution process. Preferably the top electrode further comprises a tungsten layer 114 with a thickness between about 5 nm and 25 nm and is formed over any remaining or added metal film 112.

The stack of blanket layers is patterned using a mask that forms pillars, preferably less than about 250 nm in width and preferably separated from one another by at least about 300 nm, using standard photolithographic techniques as are known in the art. The layers from the bottom electrode 103 to the top electrode 114 are then etched down to the substrate 101, preferably including a physical etch component, more preferably using Ar/Cl sputtering or reactive ion etching.

Figure 2:
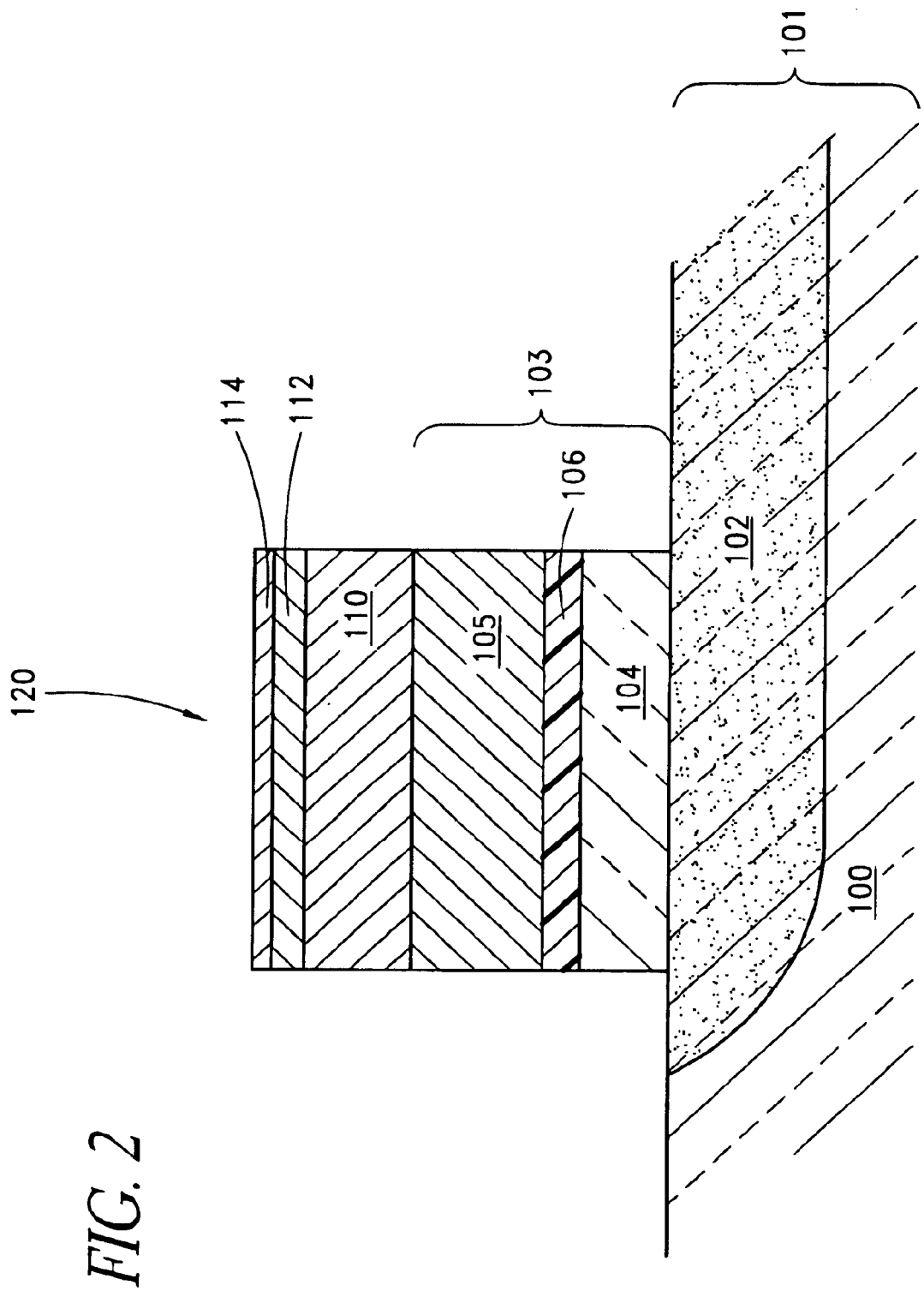
FIG. 2 is a schematic cross-section of the structure of FIG. 1 after patterning to define a programmable memory cell in a stud configuration.

As shown in FIG. 2, after patterning and etching, separate pillars 120 (one shown) of the layered materials shown in FIG. 1 remain. Each pillar 120 is an individual programmable memory cell. Preferably, the width of each cell 120 is less than about 250 nm, and the spaces between the cells are at least about 300 nm in width. The skilled artisan will readily appreciate that such spacing issues will depend upon the critical dimension for any particular generation of integrated circuit processing. Currently, state-of the-art fabrication techniques employ 0.13 μm line widths, although this critical dimension is expected to continue to shrink with each new generation of integrated circuit technology.

Figure 3:
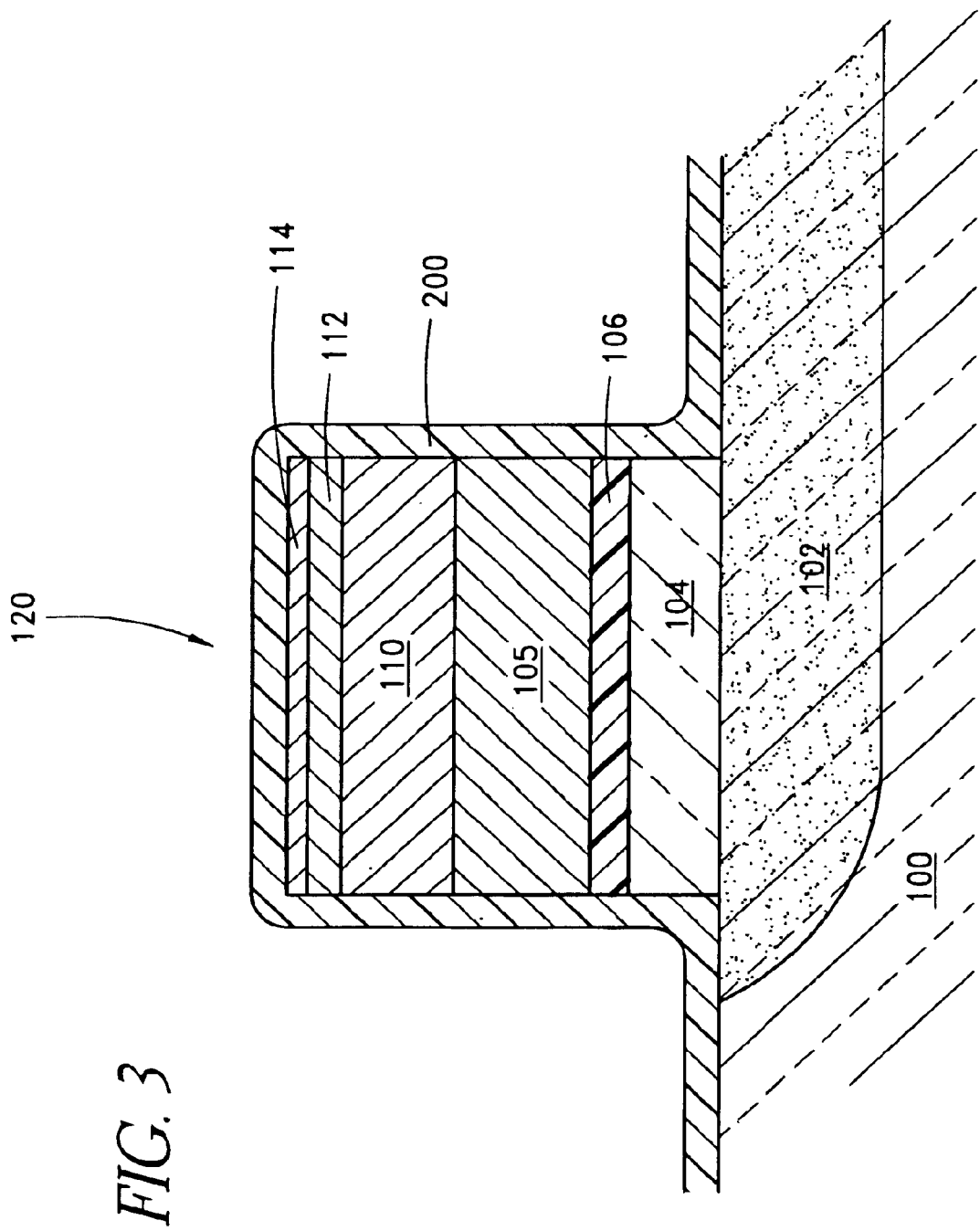
FIG. 3 is a schematic cross-section of the programmable memory cell of FIG. 2 after deposition of a thin, conformal sealing layer.

FIG. 3 shows an exemplary memory cell 120, covered by a blanket liner layer 200 of insulating material, preferably between about 5 nm and 50 nm in thickness, and also preferably comprising a material that can serve as a diffusion barrier. The liner layer 200 is selected to prevent diffusion of metal from metal film 112 away from the cell 120 and into other areas of the integrated circuit, where it could cause severe problems. In the illustrated embodiment, the liner layer 200 comprises silicon nitride that conforms over the cells and the semiconductor base material.

Silver is a fast diffuser in semiconductor devices, and normally it is used in integrated circuits only with extreme caution. Similarly, all metals suitable for doping the glass electrolyte body 110 will be fast diffusers. Fabrication of the memory cell array of the illustrated embodiment comprises deposition of a blanket layer of silver to a thickness of about 30 nm. Much of the blanket layer is removed during etching to form individual memory cell stacks 120. The silver that remains in the individual cells is encapsulated by the liner layer 200 to prevent it from diffusing away from the cell 120.

FIG. 4A shows two memory cells 120 in a memory array after blanket deposition of an insulating layer 210 to fill the spaces between the separate cells 120. In the illustrated embodiment, the insulating material 210 is silicon oxide deposited using TEOS, although the skilled artisan will readily appreciate that other insulating materials (e.g., low k materials) known in the art can be used readily with good result.

Electrical contacts are made to the electrodes of the memory cells 120 as shown in FIG. 4B. At least some of the insulating material 210 and/or liner layer 200 are removed from the upper surface of electrode layer 114. These materials can be removed by chemical mechanical polishing (CMP), arranged to stop on and expose the top surface of electrode layer 114, or alternatively by patterning and etching, preferably dry etching, as shown in FIG. 4B, or any other method known in the art. Note that the drawings are not to scale and that the openings for making contact can be comparable to the dimensions of the cell 120 top surface. In addition, vias are etched through the insulating layer 210 between cells down to the conducting region 102 of the semiconductor substrate 101. A conducting material is used to make contact to both the electrode layers 114 (contacts 220) and the conducting region 102 of the substrate (contacts 230). Contact 230 makes electrical connection to the lower electrode 103 through conducting region 102.

The preferred embodiment thus involves an array of programmable conductor memory cells wherein each cell comprises stacked materials on a semiconductor substrate. The regions between the cells comprise insulating material, preferably including a thin barrier layer 200 (preferably silicon nitride) conforming to the cells 120 and to the substrate 100 and a thick layer of insulation 210 (preferably a form of silicon oxide) that fills in the remaining space between the cells. Preferably, the barrier layer 200 is between about 5 nm and 50 nm thick. Preferably, the silicon oxide 210 is deposited from tetraethylorthosilicate (TEOS).

Each programmable conductor memory cell 120 comprises the layers discussed above in reference to FIGS. 1–4. These include a bottom electrode 103 comprising one or more layers, a cell body 110 that includes glass electrolyte layer having metal ions diffused therein and a top electrode 112, 114.

As described above, the bottom electrode 103 preferably comprises a polysilicon layer 104, a tungsten nitride layer 106 and a tungsten layer 108. Preferably, the polysilicon layer 104 is between about 25 nm and 75 nm thick, the tungsten nitride layer 106 is between about 5 nm and 40 nm thick and the tungsten layer 108 is between about 50 nm and 100 nm thick.

In the illustrated embodiment, the glass electrolyte material 110 comprises a chalcogenide glass with metal ions diffused therein, more preferably silver germanium selenide, typically of the form $Ag/Ge_{25}Se_{75}$. The thickness of the silver germanium selenide layer is preferably between about 25 nm and 75 nm. There is some silver film 112 remaining over the glass after silver ions have been driven into the Ge—Se, whether left over from photodissolution or deposited after forming the electrolyte 110.

Preferably the top electrode also comprises a tungsten layer 114 over the silver film 112 with a thickness between about 5 nm and 25 nm.

In operation, the memory cell body 110, i.e., the glass electrolyte material having metal ions therein, forms conductive pathways that grow from the negative electrode to the positive electrode when a first voltage is applied to the electrodes 103, 114. The growth of the conductive pathways depends upon applied voltage and time. Low voltages cause slow growth, whereas higher voltages result in faster growth of conductive path(s) from the negative electrode to the positive electrode. Without being limited by theory, it is believed that the conductive pathways grow by precipitation of cations (e.g., silver cations) from the memory cell body 110. Changes in the extent of the conductive pathways affect the resistance of the devices. The conductive pathway remains intact when the voltage is removed.

For a binary programmable conductor memory device, the memory has two basic states: 0 and 1. When there is no conductive pathway, the memory cell has high electrical resistance and reads as 0. When the conductive pathway shorts the memory cell body, from the cathode to the anode, the resistance is low and the memory cell reads as 1. The change in resistance of the memory cell with and without a conductive pathway can be as much as two orders of magnitude, i.e., a change from Megaohms to milliohms. Reversing the polarity of the voltage preferably reverses the conductive pathway.

Alternatively, the memory cell can be programmed into as many as 3 or 4 states by setting the extent of the conductive pathway. These changes can be detected easily by passing current through the bit lines and word lines (not shown) connected to the contacts 220, 230 in the memory array, such that changing the extent of the pathways can serve to change the state of the memory bit.

Although the foregoing description of the preferred embodiment of the present invention has shown, described and pointed out the fundamental novel features of the invention, it will be understood that various omissions, substitutions and changes in the form of the detail of the apparatus as illustrated as well as the uses thereof may be made by those skilled in the art, without departing from the spirit of the present invention. Consequently, the scope of the present invention should not be limited to the foregoing discussion, but should be defined by the appended claims.

I claim:

1. A method of fabricating switching devices for integrated circuits, comprising:
   forming a bottom electrode in contact with a conductive region in a semiconductor base material;
   providing a glass electrolyte layer having metal ions diffused therein and being capable of changing resistance under the influence of an applied voltage;
   forming a top electrode layer; and
   patterning and etching through the top electrode layer, the glass electrolyte layer and the bottom electrode to define separate pillars of stacked materials.

2. The method of claim 1, further comprising forming a liner layer of an insulating material that conforms to the pillars and the semiconductor base material after patterning and etching.

3. The method of claim 2, wherein forming the liner layer comprises depositing silicon nitride.

4. The method of claim 2, further comprising foring an insulating layer to fill at least the spaces remaining between the separate pillars of stacked materials after forming the liner layer.

5. The method of claim 4, wherein forming the insulating layer to fill at least the spaces remaining between the pillars comprises depositing silicon oxide from TEOS.

6. The method of claim 4, further comprising removing at least some of the insulating layer and some of the liner layer to make contact to the top electrode layer.

7. The method of claim 6, wherein removing at least some of the insulating layer and some of the liner layer to make contact to the top electrode comprises chemical mechanical polishing.

8. The method of claim 6, wherein removing at least some of the insulating layer and some of the liner layer to make contact to the top electrode comprises dry etching.

9. The method of claim 1, wherein forming the bottom electrode layer comprises:
   forming a layer of polysilicon onto the semiconductor base material;
   forming a layer of tungsten nitride over the polysilicon ; and
   forming a layer of tungsten over the tungsten nitride.

10. The method of claim 1, wherein providing a glass electrolyte layer having metal ions diffused therein comprises:
    depositing a metal film over the glass layer; and
    providing energy to the metal film and the glass layer to cause metal ion diffusion into the glass layer, thereby forming the glass electrolyte layer.

11. The method of claim 10, wherein depositing the glass layer comprises depositing a chalcogenide glass whose composition is selected from one or more elements of the group consisting of sulfur, germanium, selenium and tellurium.

12. The method of claim 10, wherein depositing the metal film comprises depositing a metal selected from the group consisting of Group IB and Group IIB metals.

13. The method of claim 10, wherein depositing the metal film comprises depositing silver.

14. The method of claim 10, wherein providing energy to the metal film and the glass layer comprises e forming xposing to ultraviolet radiation.

15. The method of claim 14, wherein exposing to ultraviolet radiation comprises using ultraviolet radiation with a wavelength of less than 500 nm at about 4 mW/cm$^2$ for about 15 mins.

16. The method of claim 10, wherein forming the top electrode includes leaving a portion of the metal film over the glass electrolyte layer.

17. The method of claim 1, wherein forming a top electrode layer comprises deposition of tungsten.

18. The method of claim 1, wherein patterning comprises photolithographic techniques.

19. The method of claim 1, wherein etching includes a physical etch component.

20. The method of claim 19, wherein the etching comprises sputter etching.

21. The method of claim 19, wherein the etching comprises reactive ion etching.

22. The method of claim 1, wherein the separate pillars of stacked materials are less than about 250 nm in width.

23. The method of claim 1, wherein the spaces between separate pillars of stacked materials are at least about 300 nm in width.

24. A method of fabricating programmable conductor memory cells on a substrate by blanket layer deposition, comprising:
    forming a bottom electrode layer in contact with a conductive region in a semiconductor base material;
    providing a chalcogenide glass layer having metal ions diffused therein and being capable of changing resistance under the influence of an applied voltage;
    forming a top electrode layer; and
    removing the bottom electrode layer, the chalcogenide glass layer and the top electrode layer together from portions of the substrate, thus leaving individual pillars standing separately on the substrate.

25. A method of fabricating programmable conductor memory cells by blanket layer deposition and post-patterning, comprising:
    forming a bottom electrode comprising tungsten in contact with a conductive region in a silicon substrate;
    providing a germanium selenide glass layer having silver ions diffused therein;
    forming a top electrode layer comprising tungsten;
    identifying defined cell regions; and
    etching off blanket layers down to the silicon substrate that are not within the defined cell regions.

26. The method of claim 25, further comprising forming a liner layer of silicon nitride that acts as a diffusion barrier and conforms over the cells and the silicon substrate.

27. The method of claim 26, further comprising forming an insulating layer to fill at least the spaces between the separate cells.

* * * * *

UNITED STATES PATENT AND TRADEMARK OFFICE
CERTIFICATE OF CORRECTION

PATENT NO. : 6,858,482 B2
DATED : February 22, 2005
INVENTOR(S) : Terry L. Gilton It is certified that error appears in the above-identified patent and that said Letters Patent is hereby corrected as shown below:

Title page,
Item [56], References Cited, OTHER PUBLICATIONS,
"McHardy et al., *The dissolution of metals in amorphous chalcogenides and the effects o electron and ultraviolet radiation*, 20 J. Phys. C.: Solid State Phys., pp. 4055-4075 (1987)f." should read -- McHardy et al., *The dissolution of metals in amorphous chalcogenides and the effects of electron and ultraviolet radiation*, 20 J. Phys. C.: Solid State Phys., pp. 4055-4075 (1987). --
"Chatterjee, R.; Asokan, s.; Titus, S.S.K., Current-controlled negative-resistance behavior and memory switching in bulk As-Te-Se glasses, J. Phys. D: Appl. Phys. 27 (1994) 2624-2627" should read -- Chatterjee, R.; Asokan, S. ; Titus, S.S.K., Current-controlled negative-resistance behavior and memory switching in bulk As-Te-Se glasses, J. Phys. D: Appl. Phys. 27 (1994) 2624-2627. --
"Joulie, A.M.; Marucchi, J., On the DC electrical conduction of amorphous As2Se7 before switching, Phys. Stat. Sol. (a) 13 (1972) K105-K109" should read -- Joullie, A.M.; Marucchi, J., On the DC electrical conduction of amorphous As2Se7 before switching, Phys. Stat. Sol. (a) 13 (1972) K105-K109. --
"Joulie, A.M.; Marucchi, J., Electrical properties of the amorphous alloy As2Se5, Mat. Res. Bull. 8 (1973) 433-442" should read -- Joullie, A.M.; Marucchi, J., Electrical properties of the amorphous alloy As2Se5, Mat. Res. Bull. 8 (1973) 433-442. --
"Rose, M.J.; Hajto, J.; Lecomber, P.G.; Gage, S.M.; Choi, W.K-.; Snell, A.J.; Owen, A.E., Amorphous silicon analogue memory devices, J. Non-Cryst. Solids 115 (1989) 168-170" should read -- Rose, M.J.; Hajto, J.; Lecomber, P.G.; Gage, S.M.; Choi, W.K.; Snell, A.J.; Owen, A.E., Amorphous silicon analogue memory devices, J. Non-Cryst. Solids 115 (1989)168-170. --

Column 1,
Line 42, "on another" should read -- one another --.

Column 6,
Line 59, "foring" should be -- forming --.

UNITED STATES PATENT AND TRADEMARK OFFICE
CERTIFICATE OF CORRECTION

PATENT NO. : 6,858,482 B2  
DATED : February 22, 2005  
INVENTOR(S) : Terry L. Gilton It is certified that error appears in the above-identified patent and that said Letters Patent is hereby corrected as shown below:

Column 7,
Lines 33-34, "e forming xposing" should read -- exposing --.

Signed and Sealed this

Twelfth Day of July, 2005

JON W. DUDAS
*Director of the United States Patent and Trademark Office*